United States Patent
Meier (10) Patent No.: US 10,530,606 B2
(45) Date of Patent: Jan. 7, 2020

(54) METHOD FOR TRANSMITTING DATA VIA A SERIAL COMMUNICATION BUS, BUS INTERFACE, AND COMPUTER PROGRAM

(71) Applicant: VOLKSWAGEN AG, Wolfsburg (DE)

(72) Inventor: Alexander Meier, Wolfsburg (DE)

(73) Assignee: Volkswagen AG (DE)

( * ) Notice: Subject to any disclaimer, the term of this patent is extended or adjusted under 35 U.S.C. 154(b) by 0 days.

(21) Appl. No.: 16/029,054

(22) Filed: Jul. 6, 2018

(65) Prior Publication Data
US 2019/0020499 A1   Jan. 17, 2019

(30) Foreign Application Priority Data
Jul. 11, 2017   (DE) .......................... 10 2017 211 860

(51) Int. Cl.
*H04L 12/413* (2006.01)
*H04L 12/40* (2006.01)
*H03M 13/09* (2006.01)

(52) U.S. Cl.
CPC ........ *H04L 12/4135* (2013.01); *H03M 13/09* (2013.01); *H04L 12/40032* (2013.01); *H04L 12/40084* (2013.01); *H04L 12/40143* (2013.01); *H04L 12/40156* (2013.01); *H04L 2012/40215* (2013.01)

(58) Field of Classification Search
CPC ........... H04L 12/4135; H04L 12/40032; H04L 12/40084; H04L 12/40143; H04L 12/40156; H03M 13/09
See application file for complete search history.

(56) References Cited

U.S. PATENT DOCUMENTS

| | | | | |
|---|---|---|---|---|
| 2014/0071995 A1* | 3/2014 | Hartwich | .............. | H04L 1/0002 370/468 |
| 2014/0129900 A1* | 5/2014 | Hartwich | ............ | G06F 13/4282 714/758 |
| 2014/0201410 A1* | 7/2014 | Hartwich | ............ | G06F 13/4282 710/116 |

(Continued)

FOREIGN PATENT DOCUMENTS

| | | |
|---|---|---|
| DE | 102011006884 A1 | 10/2012 |
| DE | 102011122843 A1 | 1/2013 |

(Continued)

OTHER PUBLICATIONS

Bosch, CAN with Flexible Data Rate (CAN-FD) Specification version 1.0, Apr. 17, 2012 (Year: 2012).*

(Continued)

*Primary Examiner* — Tim T Vo
*Assistant Examiner* — Phong H Dang
(74) *Attorney, Agent, or Firm* — Barnes & Thornburg LLP (57) ABSTRACT

An extension of the existing CAN FD data transmission protocol. The extension enables the use of the IPv6 protocol for the CAN bus. The CAN FD protocol is further developed in an incompatible way. One modification measure relates to the lengthening of the Data Field, which is positioned in the transmission frame after an Arbitration Field. An arbitrary number of bytes can be entered in the extended Data Field within a specified upper limit. Since the Data Field is transmitted at a higher bit rate field than the Arbitration Field, the data throughput is increased dramatically.

30 Claims, 7 Drawing Sheets

(56) References Cited

U.S. PATENT DOCUMENTS

2014/0328357 A1* 11/2014 Fredriksson .......... H04J 3/0614
    370/520
2016/0094312 A1* 3/2016 Fredriksson ............ H04L 12/40
    714/807
2017/0093596 A1* 3/2017 Wandel ............... H04L 43/0888

FOREIGN PATENT DOCUMENTS

| DE | 102012224024 A1 | 6/2014 |
|----|-----------------|--------|
| DE | 102015204714 A1 | 9/2016 |
| DE | 112015004473 T5 | 7/2017 |
| WO | 2015139892 A1   | 9/2015 |

OTHER PUBLICATIONS

ISO 11898-1:2015; Road Vehicles—Controller area network (CAN)—Part 1: Data link layer and physical signalling; 2015.
Search Report for German Patent Application No. 10 2017 211 860.1; dated Feb. 21, 2018.
Bosch; CAN with Flexible Data-Rate; Specification, Version 1.0; Apr. 17, 2012.
Office Action for German Patent Application No. 10 2017 012 214.8; dated Oct. 23, 2018.
ISO 11898-1:2003; Road Vehicles—Controller area network (CAN)—Part 1: Data link layer and physical signalling; Dec. 1, 2003.
Search Report for European Patent Application No. 18176209.7; dated Aug. 23, 2018.

* cited by examiner

CAN EL frame format

| Field | Number of bits | Bitrate | Bit Position 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|---|---|
| SF | 1 | slow | SOF | | | | | | | | | | | | | | | | | | | | | | | | |
| AF | 34 | slow | Extension0 | Extension1 | ID31 | ID30 | ID29 | ID28 | ID27 | ID26 | ID25 | ID24 | ID23 | ID22 | ID21 | ID20 | ID19 | ID18 | ID17 | ID16 | ID15 | ID14 | ID13 | ID12 | ID11 | ID10 | ID9 |
| CF | 14 | fast | ESI | DLC12 | DLC11 | DLC10 | DLC9 | DLC8 | DLC7 | DLC6 | DLC5 | DLC4 | DLC3 | DLC2 | DLC1 | DLC0 | | | | | | | | | | | |
| DF | 0 to 32768 (multiple of 8) | fast | Data0 | Data1 | Data2 | Data3 | Data4 | Data5 | Data6 | Data7 | Data8 | Data9 | Data10 | Data11 | Data12 | Data13 | Data14 | Data15 | Data16 | Data17 | Data18 | Data19 | Data20 | Data21 | Data22 | Data23 | Data24 |
| CRCF | 51 | fast | FixedStuff0 | Stuff11 | Stuff10 | Stuff9 | Stuff8 | Stuff7 | Stuff6 | Stuff5 | Stuff4 | Stuff3 | FixedStuff1 | Stuff2 | Stuff1 | Stuff0 | CRC31 | CRC30 | CRC29 | CRC28 | CRC27 | CRC26 | FixedStuff2 | CRC25 | CRC24 | CRC23 | CRC22 |
| EF | 16 | slow | ACK | ACKDel | EOF10 | EOF9 | EOF8 | EOF7 | EOF6 | EOF5 | EOF4 | EOF3 | EOF2 | EOF1 | EOF0 | IFS2 | IFS1 | IFS0 | | | | | | | | | |

METHOD FOR TRANSMITTING DATA VIA A SERIAL COMMUNICATION BUS, BUS INTERFACE, AND COMPUTER PROGRAM

PRIORITY CLAIM

This patent application claims priority to German Patent Application No. 10 2017 211 860.1, filed 11 Jul. 2017, the disclosure of which is incorporated herein by reference in its entirety.

SUMMARY

Illustrative embodiments relate to the technical field of serial data transmission between electronic components, in particular, control units, sensors and actuators, which are interconnected via a bus system. Such control units are widely used in transportation vehicles. Networked control units, sensors and actuators are also used in other fields of technology, e.g., in automation technology, process engineering, etc. Illustrative embodiments also relate to a correspondingly designed bus interface as well as a correspondingly designed computer program.

BRIEF DESCRIPTION OF THE DRAWINGS

An exemplary embodiment is shown in the drawings and is explained in more detail by reference to the figures. Shown are.

DETAILED DESCRIPTION

In modern transportation vehicles, a plurality of control units is installed. A number of control units are used for the powertrain alone, such as the engine control unit, transmission control unit, ESP control unit, chassis control unit and others. In addition, there are other control units that are installed in the area of the transportation vehicle bodywork and provide certain comfort functions. Examples of these include the electric door or window control units, air-conditioning control units, seat adjustment control units, airbag control units and similar devices. Then there are also control units associated with the infotainment area, such as a camera control unit for environment monitoring, navigation device, radar or lidar equipment, communication module and entertainment module with TV, radio, video and music function. For the infotainment area of the transportation vehicle-internal networking of control devices, IP communications such as IPv6 or IPv4 will be used in future. This method works by transmission of IP packets, which can have a length of up to 64 kbyte. Although the IP packets can be transmitted in segmented form, the use of IP communication still requires a bus technology to be used, which can transmit sufficiently large messages. It is required that packets of at least 1280 bytes in size can be transmitted as an MTU (Maximum Transmission Units), as they are known in the Ethernet standard. However, neither the classical CAN Bus 2.0, standing for Controller Area Network, used in transportation vehicles nor the already extended CAN FD Bus, standing for Controller Area Network Flexible Data Rate satisfies this requirement, since they can only transmit messages with a maximum size of 8 and 64 bytes respectively. This makes the use of the CAN bus unsuitable if it is to support the required IPv6 communication. Further details of the IPv6 protocol can be found in the RFC 2460 Specification from the Internet Engineering Task Force IETF.

Typically, the control units of the different categories are each networked with a separate bus appropriately designed for the category of device. Several different bus systems can therefore be used in the transportation vehicle. The different bus systems can be interconnected via gateways to allow a data exchange. In the area of powertrain control units, the CAN bus is typically used, as is also the case in the area of comfort control units. In the infotainment area, other bus systems are also commonly used, such as bus systems based on Ethernet technology, e.g., AVB (Audio Video Bridging) which is based on the standard family according to the IEEE 802.1 standard. Bus systems in which the data transmission takes place via fiber-optic cables can also be used. Examples to be cited are the MOST bus (Media Oriented System Transport) or the D2B bus (Domestic Digital Bus).

There is the possibility over CAN 2.0 or CAN FD to use a transport protocol such as ISO TP as an intermediate layer to transmit IPv6 packets. However, this has some drawbacks.

The use of the ISO TP transport protocol for transmitting IP packets has the major drawback that it implies the necessity for segmentation. This increases the susceptibility to errors and causes an overhead in the transmission of data. This overhead is caused in part by the transport protocol itself. On the other hand, a large part of the overhead is caused by the CAN FD protocol itself. Every CAN FD transmission frame consists of an arbitration phase, in which bits are transmitted with a slow data rate, and a data phase, in which the specified fast data rate can actually be used. Accordingly, the more the arbitration phase occurs, the less the high data rate of the data phase can be used. This drawback is all the more serious, since the achievable data rates with the CAN bus technology are already limited because of the particular bus access method.

Another major drawback of the use of the ISO TP is that in accordance with ISO TP, stateful point-to-point connections are used to transmit data. This prohibits the use of the multicast functionalities of the IPv6 standard. On the other hand, the positive attribute that IPv6 packets are stateless and can be transmitted independently of other IPv6 packets, is lost. When using ISO TP, the transmission of an IPv6 packet depends on whether the previous packet has been transmitted successfully.

Another drawback in using ISO TP to enable IPv6 communication over CAN FD is that due to the operating principle based on stateful point-to-point connections, very long latency times are obtained for the transmission of data. For real-time applications, where short response times are important, this is unsuitable. Up to now, in the automotive sector IPv6 communication has hardly been used, since it involves high resource consumption. The standard approach to enable IPv6 communication is to use Ethernet technology, which is expensive for the automotive industry, as a networking technology.

The ISO standard ISO 11898-1 2015-12-00 "Road vehicles—Controller Area Network (CAN)—Part 1: Data link layer and physical signalling" refers to a transmission frame with an arbitration field and a data field, in which a low bit rate is set for the arbitration phase and a higher bit rate is set for the transmission of the data in the data field. The number of data bytes for classical transmission frames is specified as a maximum of 8 bytes. All values in between are allowed. For FD transmission frames, a maximum of 64 bytes is allowed in the data field. Values of 12, 16, 20, 24, 32, or 48 bytes of data are also possible.

DE 10 2011 006 884 A1 discloses a method and a device for increasing the data transmission capacity in a serial bus system. This document also discloses the use of a transmission frame with an arbitration field and a data field, in which a low bit rate is set for the arbitration phase and a higher bit rate is set for the transmission of the data in the data field.

DE 10 2011 122 843 A1 discloses a method and a device for serial data transmission with flexible message size and variable bit length.

DE 11 2015 004 473 T5 discloses a high-speed data transmission protocol for control purposes.

The disclosed embodiments overcome the described drawbacks in the introduction of IP communications in the automotive sector.

Disclosed embodiments provide a method for transmitting data over a serial communication bus, a correspondingly designed bus interface and a correspondingly designed computer program.

The disclosed approach further develops the CAN protocol dominant in the automotive industry in a self-incompatible way to make it suitable for IP communication. In the following the newly proposed extended CAN protocol is abbreviated as the CAN EL protocol.

The first measure by which the existing Protocol CAN FD is extended is that, in a method for the transmission of data over a serial communication bus in which the data is transmitted with a transmission frame, wherein the transmission frame has at least one arbitration field and one data field, the length of the data field in the transmission frame is expanded dramatically. The arbitration field is used to control the bus access according to the CSMA-CR method, which stands for Carrier Sense Multiple Access with Collision Resolution, by prioritization of the messages based on an identifier. As in the CAN FD bus, a low bit rate is set for the arbitration phase and an increased bit rate is set for the transmission of the data in the data field. The extension of the length of the user data field means that the drawback in the CAN FD bus, that due to the limitation of the length of the user data field specified there to a maximum of 64 bytes the benefit of the higher bit rate is hardly used, can be avoided in the extended CAN EL bus proposed here. The measure offers the benefit of a significantly increased data rate/bandwidth for the data transmission. This also means a significantly improved efficiency in the transmission of large data packets. At the same time, the existing restriction in the CAN FD bus that only certain numbers of bytes are possible within the user data field with a maximum size of 64 bytes, is lifted. The options to be used therefore become more flexible.

The variability of the length of the user data field guarantees many application possibilities. This means that no compromise must be made if the particular application requires a high net data rate, or in another case if the real-time capability is more of a priority and low latency times are more important.

Here it is beneficial if a range of 0 to 4096 bytes is specified for the variable length of the data field. This allows a good interoperability with the now widely applicable 1 Gbit Ethernet option. Routing between a part of the transportation vehicle network where the 1 Gbit Ethernet bus option is used would then be possible without segmentation. The use of IP communication then becomes possible without problems.

It is also beneficial if the length of the arbitration field is set to 32 bits. In the CAN FD standard, a length of 29 bits would be specified for this field. This measure simplifies the hardware development for the extended CAN EL bus. Register lengths commonly used today are typically a multiple of one byte, i.e., a multiple of 8 bits.

It is also beneficial if, as in the CAN FD protocol, a control field is provided in the transmission frame between the arbitration field and data field, in which at least one section is allocated for the length specification in terms of the data field. Here, this section therefore needs to be lengthened to be able to specify the full length of 4096 bytes. This requires 13 bits.

As in the CAN 2.0 protocol and CAN FD protocol, it is beneficial if a CRC field is provided in the transmission frame, in which at least one section is provided for a CRC check code. The CRC check code used for error detection in accordance with the well-known cyclic redundancy check algorithm.

Here, as in the CAN FD protocol, it is beneficial if a start field is provided in the transmission frame and the CRC test code is calculated over the start field, control field, arbitration field and data field.

The same applies to the use of the bit-stuffing method, which was also already used in the CAN 2.0 protocol and the CAN FD protocol. An noteworthy feature here is that the data transmission takes place asynchronously and to ensure the synchronization of the data transmitting station and data receiving station a resynchronization is performed according to a bit-stuffing rule, wherein the bit-stuffing rule is applied over the areas from the start field up to the end of the data field, wherein the number of the inserted stuff bits is entered in a section of the CRC field as a check. The insertion of a stuff bit forces an edge change on the bus, which is used in the CAN controller for resynchronization of the timer, which sets the sampling rate for the bit recovery when receiving data. A modified bit-stuffing rule is used in this case. The bit-stuffing algorithm (frame encoding) for the new transmission format is modified to the effect that a stuff-bit is inserted only after 10 consecutive bits with the same bus level, and not after 5 bits as in CAN 2.0 and CAN FD. This means fewer "overhead" bits are needed in the data frame, which increases the efficiency of the data transmission.

It is beneficial if an end field is also provided in the transmission frame and at least one end-of-frame code is entered in the end field, wherein the end-of-frame code has a length of 11 bits. This measure is beneficial due to the modified bit-stuffing rule. Sending the end-of-frame code enforces a violation of the new bit-stuffing rule, so that subscribers that were not synchronized properly detect this fact and can reset the CAN controller so that they can become correctly synchronized again.

In the CRC field the bit-stuffing rule in accordance with the extended protocol is not used. Therefore it is also beneficial if a stuff-bit is forcibly inserted in the CRC field at fixed specified positions. Edge changes are thus also guaranteed in the CRC field and the CAN controllers of the bus subscribers remain synchronized.

In a disclosed example, the CRC field begins with a fixed specified stuff-bit and the other fixed stuff-bits are each inserted at an interval of 9 bits of the CRC field. The fixed specified stuff-bit is complementary to its predecessor bit.

A noteworthy measure relates to the assignment of the identifiers in the arbitration field for the prioritization of the messages. According to this, the identifier in the arbitration field is divided into the areas of "Message Content" identifier and "Device" identifier. By the appropriate assignment of the device ID, one bus node can be given priority over the other subscribers on the bus. As a result, the network behavior can be planned/predicted and is therefore real-time capable. A boundary condition is that a unique device identifier is assigned to each device.

It is beneficial here if the section with the higher order bits is reserved for the prioritization of the message content and the section with the lower order bits is allocated to the device identification. As a result, as in the CAN bus, during the arbitration phase the bus access makes decisions primarily based on the message contents with different assigned priorities and only uses the device ID as a secondary criterion.

In an alternative design, a 32-bit long identifier is subdivided such that 24 bits are reserved for the prioritization of the message content and 8 bits are provided for the prioritization of the device.

In summary, by use of the measures presented the CAN FD protocol is extended in a beneficial way, so that the low hardware costs are associated with the CAN-FD bus can be retained. Also, the distributed arbitration procedure which is so essential in the automotive sector, is maintained. This is beneficial for the further transportation vehicle development, since no new cross-manufacturer specifications become necessary in this area. By maintaining the distributed arbitration and the particular design of the arbitration field the extended CAN EL BUS remains real-time capable, which is so important for its application in transportation vehicles.

Due to the built-in variability in the specification of the extended CAN EL bus protocol, the bus protocol is adaptable to the specific bus architecture. Depending on the planned size of the network the data rate can be adapted, thus allowing a cost-optimized architecture to be implemented. For example, the extended bus can even the handle the special case of a small network with only 2 nodes (point-to-point connection). This could allow data transmission to be implemented with very high data rates.

For an appropriately designed bus interface for use in the proposed method for the transmission of data over a serial communication bus, the same benefits as those described in relation to the corresponding method operations apply.

The same applies to an appropriately designed computer program, which when processed in a computation unit executes the transmitter-side operations and/or the receiver-side operations of the proposed method for transmitting data. Hardware costs are of course a key factor in the automotive sector, where less powerful microcontrollers are therefore mainly used that are supported by separate CAN controllers, in which the data transfer protocol is implemented by special hardware. In other areas, for example, in the field-bus sector for automation technology or process engineering, more powerful microcontrollers are also used, for which the software solution then also becomes an option for implementing the extended data transmission protocol.

The following description illustrates the principles of the disclosure. It goes without saying, therefore, that persons skilled in the art will be in a position to design different arrangements which, although not explicitly described here, nevertheless embody the principles of the disclosure and are also intended to fall within its scope of protection.

The CAN bus was standardized as long ago as 1994. The corresponding ISO standard has the number ISO 11898. There is a standard for the high-speed range up to 1 Mbit/s, which is the ISO 11898-2 standard. Then there is a standard for the low-speed range up to 125 kbps, which is the ISO 11898-3 standard. The ever growing volumes of data result in ever higher bus loads on the CAN buses. This led to a further development of the CAN bus. The extended CAN bus is known under the term CAN FD bus. FD stands for flexible data rate. In this option of the CAN bus, different data rates are selected. For the arbitration phase, the data rate remains low, as in the classical CAN bus. For the transmission of user data, the transmission is switched to a higher data rate. If the user data in a CAN-FD message is transmitted faster, then the period for which the bus is occupied is reduced; and the load on the bus is reduced. If the transmission duration remains in the same time frame as in classical CAN messages, larger amounts of data could be transported with a CAN-FD message. This method was also implemented in CAN FD. Instead of the 8-byte long user data field, in CAN FD a 64-byte user data field is used. In one implementation the data rate for the transmission of the user data field increases, for example, from 500 kbps to 2 Mbit/s.

Analogously to the classical CAN protocol, the CAN FD bus also recognizes, for example, two dataframe formats: standard frames with 11-bit identifiers and extended frames with 29-bit identifiers. This ensures that actual additional protocols such as CANopen and SAE J1939 can also continue to exist under CAN FD with appropriate modifications and can use the benefits described.

For CAN FD, it was decided not to introduce a separate format for remote frames. On closer inspection, however, this is not actually a restriction. Due to the lack of a data field, any increase in the data rate would have no effect. The CAN-FD protocol does allow, however, CAN FD data frames with classical CAN remote frames to be requested.

Figure 1:
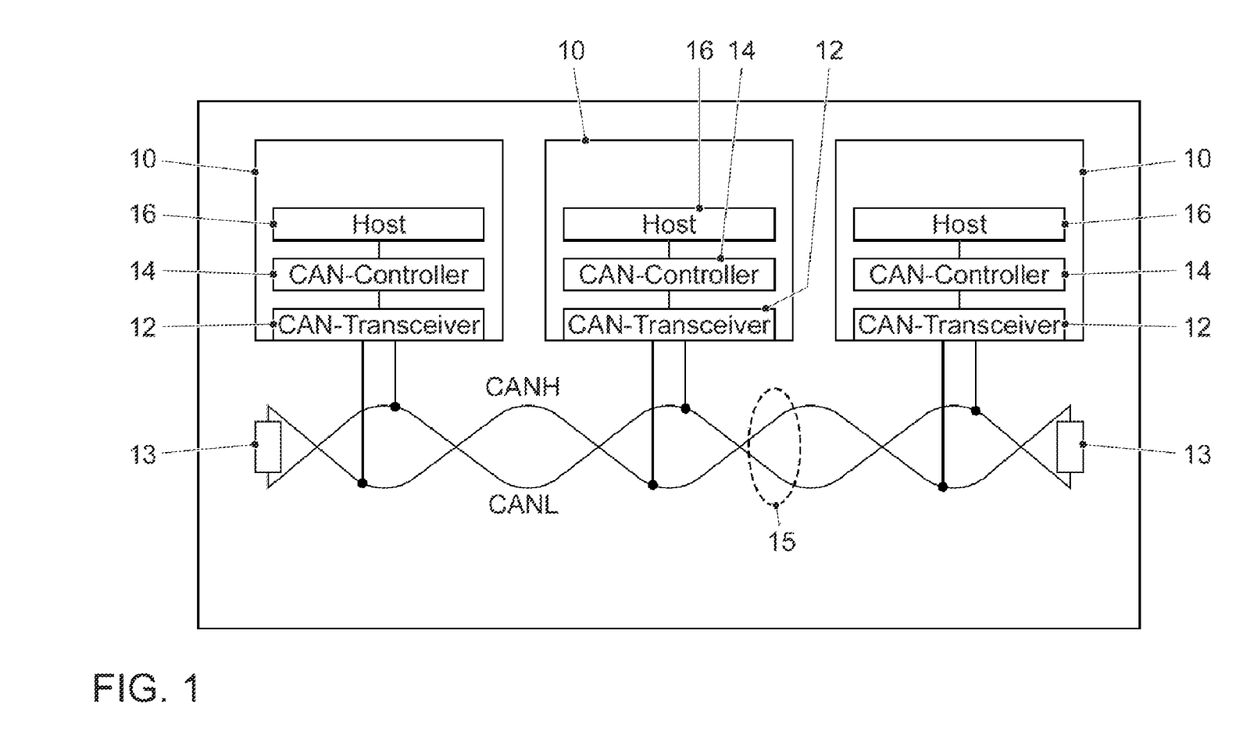
FIG. 1 shows the principle of the networking of electronic components using the CAN bus.

FIG. 1 shows the principle of the networking of electronic components using the CAN bus. A CAN network is a composite system consisting of CAN nodes (electronic components (control devices, sensors, actuators) with a CAN interface), which exchange data with one another via their respective CAN interfaces and a transmission medium (CAN bus) connecting all CAN interfaces. There are three CAN nodes 10 shown. The bus structure of the CAN bus is linear. Therefore, there is one bus line 15 to which all three CAN nodes 10 are connected. As the bus line 15 in the most common cases a twisted, unshielded two-wire cable (Unshielded Twisted Pair—UTP) is used, over which a symmetrical signal transmission takes place. In the symmetrical signal transmission, the signals are transmitted as voltage differences between two lines. The line pair is composed of a non-inverted CANH and an inverted signal line CANL. From the difference between the signals present on these two wires the receivers reconstruct the original data signal. This has the benefit that common-mode interference signals that occur on both wires of the bus line 15 are cancelled out by the difference formation and thus do not affect the transmission.

To avoid signal reflections, the bus line 15 is terminated at both ends of the cable with a terminating resistor 13 of the same size as the characteristic impedance of the bus line (120 ohms).

A CAN interface is composed of two parts: the communication software and the communication hardware. While the communication software covers higher communication services, the basic communication functions are typically implemented in hardware. Here, two hardware components are distinguished: the CAN controller 14 provides for the uniform implementation of the CAN communication protocol, thus relieving the load on the host 16 on which the above-mentioned communication software is running. The CAN transceiver 12 is responsible for the coupling of the CAN controller 14 to the CAN bus 15. It shapes the signals for data transmission during the transmission process and performs the signal processing in the receiver case. Nothing in this basic structure changes if the CAN FD bus protocol is used.

Figure 2:
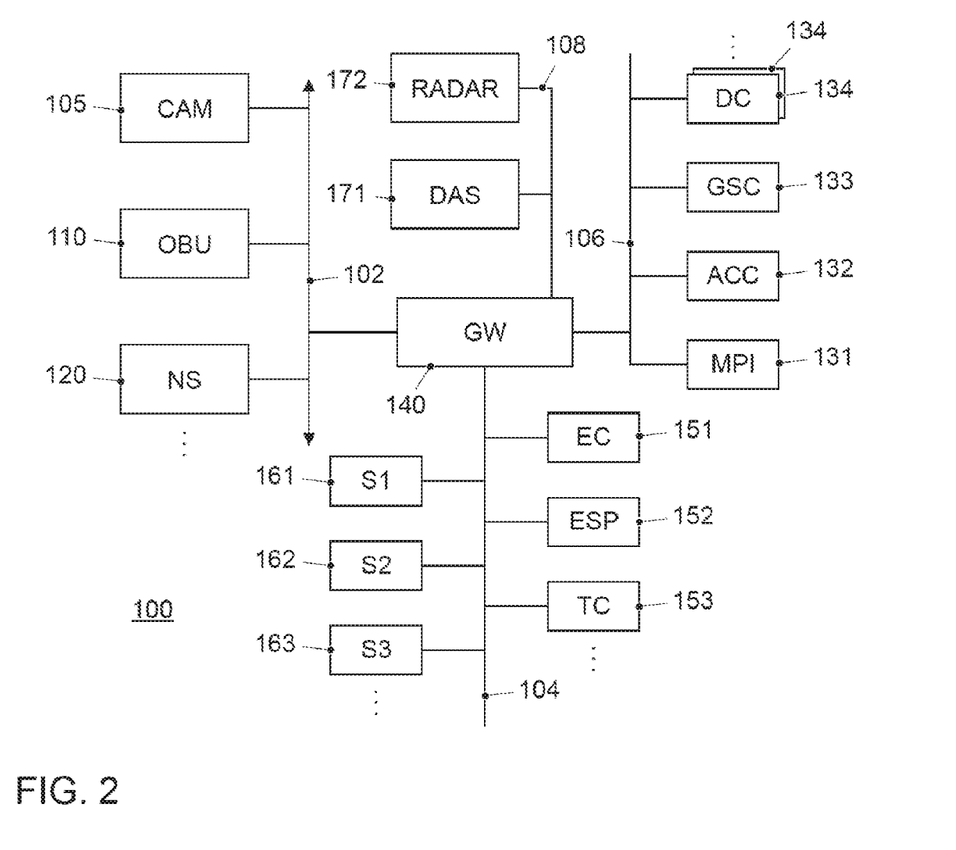
FIG. 2 shows a block diagram for a transportation vehicle on-board network with control units of different categories.

FIG. 2 shows the typical structure of an on-board network of a modern transportation vehicle. The reference numeral 151 designates an engine control unit. Reference numeral 152 corresponds to an ESP control unit and the reference number 153 designates a transmission control unit. Additional control units, such as a driving dynamics control unit etc., can be present in the transportation vehicle. The networking of these control devices, all of which are allocated to the powertrain category, is typically performed with the high-speed CAN bus system (Controller Area Network) 104. Since different types of sensors are installed in the transportation vehicle and these are no longer only connected to individual control units, such sensor data is also transmitted to the individual control units via the bus system 104. Examples of sensors in the transportation vehicle are wheel rotation speed sensors, steering angle sensors, accelerometers, angular rate sensors, tire pressure sensors, distance sensors, knock sensors, air quality sensors, etc. The various sensors with which the transportation vehicle is equipped are designated in FIG. 2 with the reference numerals 161, 162, 163. A further CAN bus 106 is often used in the transportation vehicle, mainly for networking the comfort-related components. These are, for example, door control units 134, an instrument cluster control unit 133, an air-conditioning controller 132, a selection lever control unit 131 and others. For such components the low-speed option of the CAN bus is usually sufficient.

The modern transportation vehicle can also have additional components however, such as video cameras 105, used, for example, as a reversing camera or as a driver monitoring camera, as well as a lidar or radar unit for implementing a radar cruise control or for implementing a distance warning or collision warning device.

These are often distinguished from a navigation system 120, which is also installed in the area of the cockpit. The route, which is indicated on a map, can of course also be displayed on the display in the cockpit. Additional components, such as a hands-free car kit, can be present but are not described in greater detail. The reference numeral 110 designates a further on-board unit. This on-board unit 110 corresponds to a communication module via which the transportation vehicle can transmit and receive mobile data. Typically, this is a wireless communication module, e.g., according to the LTE standard. All these devices are assigned to the infotainment area. They are therefore networked using a bus system 102 designed to meet the specific needs of this device category. This bus system is designed according to the extended CAN EL bus standard proposed here. As another example, a further CAN bus 108 is shown, which only connects the two components of driver assistance control unit 171 and radar unit 172. This CAN bus also uses the extended CAN-EL bus. This shows the wide range of applications of the extended CAN EL bus. A radar sensor or lidar sensor or a number of cameras and/or ultrasound sensors can easily generate an increased volume of data traffic. These requirements can be fulfilled with the CAN EL bus as already described.

For the purpose of transmitting transportation vehicle-relevant sensor data via the communication interface 110 to another transportation vehicle or to a central computer, the gateway 140 is provided. This is connected to the two different bus systems 102 and 104. The gateway 140 is designed to convert the data it receives via the CAN bus 104 in such a way that it is converted into the transmission format of the infotainment bus 102, so that it can be distributed in the packets specified there. For the forwarding of this data externally, i.e., to another transportation vehicle or to a central computer, the on-board unit 110 is equipped with the communication interface to receive these data packets and, in turn, convert them into the relevant transmission format of the cellular radio standard used. As shown, the gateway 140 as a central device is connected both to the high-speed CAN bus 104, and to the low-speed CAN bus 106, as well as to the CAN EL bus 102 and 108. It therefore performs all the necessary format conversions when data need to be exchanged between the various bus systems.

Figure 3:
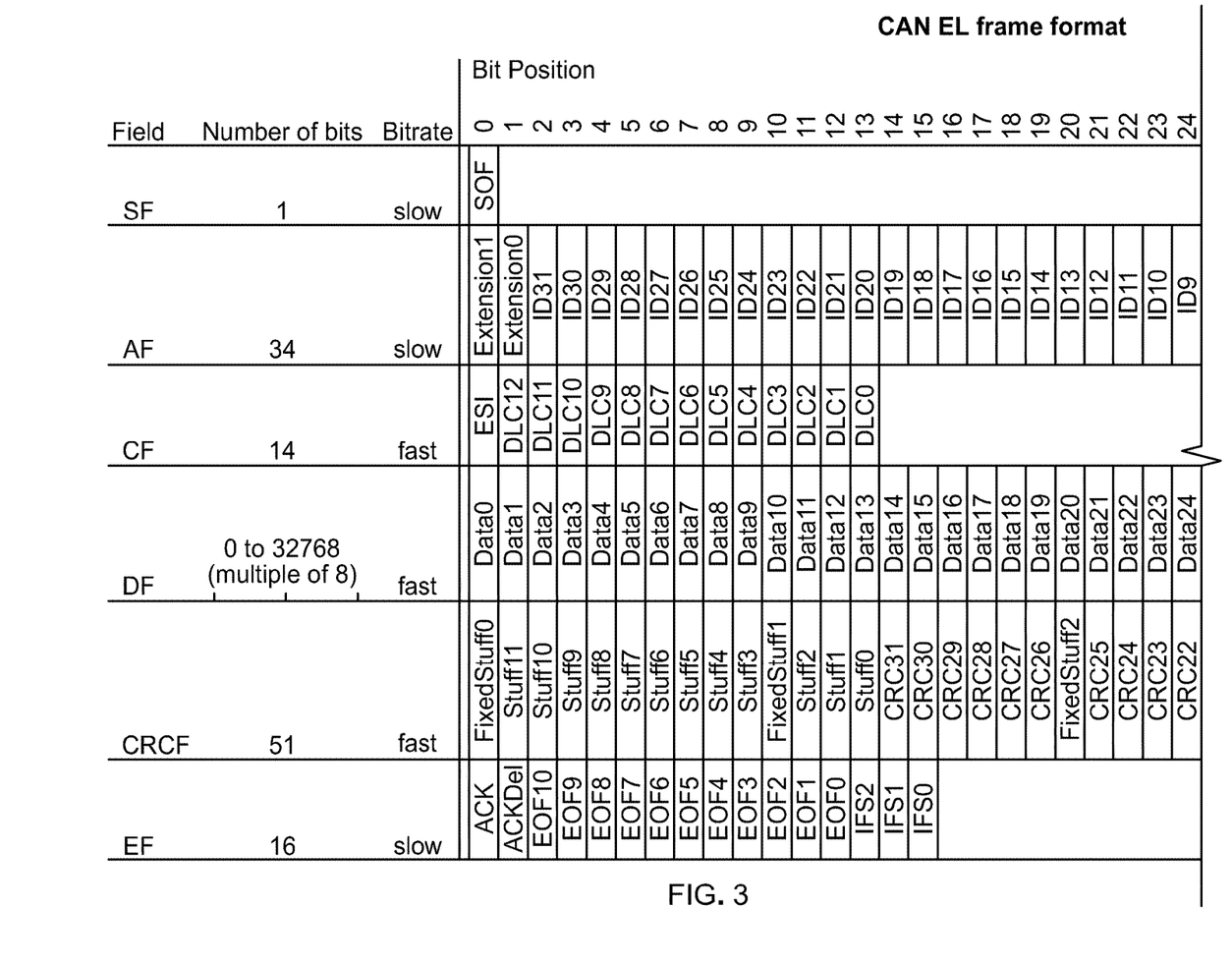
FIG. 3 shows the detailed transmission frame format according to an exemplary embodiment.

FIG. 3 shows the new transmission frame format according to the CAN EL bus standard. The proposal is based on the message layout of the MAC frames, as described in Section 10.4 of the ISO specification ISO 11898-1, 2015. In general, the functionality and meaning of the individual fields is preserved, except where deviations are explicitly discussed here.

There are many different individual bits in the transmission frame in accordance with ISO 11898-1, which fulfil control functions. As background, the different control bits with their names are listed in the following table. In subsequent mentions of these bits the full name will not be repeated.

| Control bit | Full name |
| --- | --- |
| SOF | Start of Frame |
| SRR | Substitute Remote Request |
| RTR | Remote Transmission Request |
| RRS | Remote Request Substitution |
| IDE | Identifier Extension |
| FDF | Flexible Data Rate Format Indicator |
| BRS | Bit Rate Switch |
| ESI | Error State Indicator |
| EOF | End of Frame |

The format of the table is chosen such that the individual bits for each field of the transmission frame are each specified on one line. With increased data transfer rate, the fields control field, data field and CRC field are transmitted. The increased data transfer rate is between 2000 kbps and 12000 kbps. The increment for setting the data transfer rate is 1000 kbps. For the other parts of the transmission frame, namely "Start Field", "Arbitration Field" and "End Field" the low data transfer rate which is also used in the CAN FD bus still applies, i.e., the data transfer rate can be between 500 kbps and 1500 kbps. The increment for setting the data transfer rate here is 250 kbps.

By way of deviation from the above specification, only one new transmission frame format is supported. The new transmission frame format is based on the Format FEFF ("FD Extended Frame Format").

The Start Field SF with the SOF-bit remains unchanged.

After the Start Field SF the Extension® bit and the Extension1 Bit, which are reserved for future extensions, are inserted into the arbitration field AF. These bits do not exist in the FEFF format. Both bits Extension® and Extension1 are transmitted with a "recessive" bus level.

The section for the identifier in the arbitration field AF is extended to 32 bits. The 32 bits of the identifier section are transferred as a single unit rather than in 2 different sections as in CAN FD. Accordingly, the bits SRR, RTR, RRS and IDE normally provided for the purpose of transmission frame format control are also omitted.

In the Control Field CF, the section for the length specification of the data field is extended to a length of 13 bits. In the bits DL0 to DL12 the length of the user data field is specified as the number of bytes. As a result, the numerical value in this section indicates exactly the number of bytes in the User Data field. With 13 bits the maximum number of bytes that can be encoded is 8192. But also, any whole number in this range can be encoded with it. The length of the data field should contain up to 4096 bytes, to allow space for a corresponding Ethernet packet. As the range of the Control Field with the length specification for the data field DF is 13 bits it can actually specify more bytes, but is limited to 4096 bytes by stipulation.

Therefore, an arbitrary number of bytes within the specified upper limit of 4096 can be entered in the extended Data Field DF.

The control bits FDF, BRS and the reserved res bit between the Control Field CF and Data Field DF are omitted. Only the ESI Bit is retained at this position as a control bit.

The Data Field DF can itself have variable length. Depending on the setting this can be followed by up to a maximum of 4,096 bytes. This corresponds to a length of 32768 bits.

The CRC field CF in which the CRC check code is entered is extended to a CRC length of 32 bits. The check code is entered in the bit-fields CRC0 to CRC31.

To calculate the CRC check code, the polynomial $G(x) = x^{32} + x^{26} + x^{23} + x^{22} + x^{16} + x^{12} + x^{11} + x^{10} + x^8 + x^7 + x^5 + x^4 + x^2 + x + 1$ is used.

The selected polynomial corresponds to the polynomial which is used in the IEEE 802.3 specification for Ethernet.

The CRC checksum must be calculated from the SOF bit up to the final bit of the stuff-bit counter (Stuff0).

The Stuff Count section in the CRC field CF is amended to a length of 12 bits and relates to the bits Stuff® to Stuff11. The data entered in the Stuff Count section is the number of stuff bits inserted in the field from the SOF bit up to the final bit of the Data Field DF. The number of stuff-bits is binary-coded. The use of bit-stuffing is simplified however, compared to the bit-stuffing used in the CAN-FD standard. On this point, the CAN-EL bus has also been optimized relative to the CAN-FD bus, as described in detail in the following.

The insertion of stuff-bits is used for the purpose of synchronization in asynchronous data transmission. The synchronous operation of the communication partners is established using the signal edge of the start bit SOF of a CAN message changing from recessive to dominant. A resynchronization mechanism in addition to the SOF bit ensures the maintenance of the synchronous operation. The resynchronization mechanism is based on the analysis of signal edges changing from recessive to dominant. For the synchronization to be maintained, the bit-stuffing mechanism was introduced into the CAN standard. In the ISO standard ISO 11898-1 it is specified that after a maximum of five homogeneous bits a complementary bit must be transmitted, even if a complementary bit would follow after five homogeneous bits anyway. The location of the stuff-bits is known to the receiver due to the rule, and it can ignore the stuff bits.

The bit-stuffing algorithm (frame encoding) for the new transmission format is modified to the effect that a stuff-bit is inserted only after 10 consecutive bits with the same bus level, rather than after 5 bits. This means fewer overhead bits are needed in the data frame, which increases the efficiency of the data transmission.

The variable bit-stuffing is only carried out for the bits from the SOF up to the final bit of the data field DF. From the CRC field CF on, predefined stuff-bits (FixedStuffx) are used. The FixedStuff bits are always inserted after 9 bits.

These are the bits FixedStuff0, FixedStuff1, FixedStuff2, FixedStuff3, FixedStuff4 and FixedStuff5. The individual stuff bits in the CRC field are each transmitted with the complementary level of the bit transmitted immediately preceding it.

As a result of these permanently specified stuff-bits FixedStuff0, FixedStuff1, FixedStuff2, FixedStuff3, FixedStuff4 and FixedStuff5, a guaranteed edge change is effected at the desired location during transmission.

The bit FixedStuff0 is transmitted between the last data bit and the bit Stuff11.

The bit FixedStuff1 is transmitted between the bit Stuff3 and bit Stuff2.

The bit FixedStuff2 is transmitted between the bit CRC26 and bit CRC25.

The bit FixedStuff3 is transmitted between the bit CRC17 and bit CRC16.

The bit FixedStuff4 is transmitted between the bit CRC8 and bit CRC7.

The bit FixedStuff5 is transmitted between the bit CRC0 and bit CRCDel.

The CRCDel bit, which acts as a CRC delimiter, remains unchanged and has the same function as in the CAN FD standard.

In the End Field EF, both bits ACK and ACKDel remain unchanged.

In the End Field EF, the section with the EOF identifier is extended to 11 bits. Here, instead of the standard 7 consecutive recessive bits in the CAN bus, 11 recessive bits are therefore transmitted. The extension of the EOF symbol is a consequence of the modification of the stuffing algorithm. Only after 11 consecutive bits of the same bus level is the new stuffing rule violated. This is exploited here.

In the CAN bus and CAN FD bus a so-called Intermission Field is inserted between two transmitted data frames. Here, 3 consecutive recessive bits IFS2 to IFS0 are again transmitted. From these the CAN controllers detect that the bus has been enabled again. This rule is also used preserved in the CAN EL transmission format.

As described, two different bit rates are used for the transmission of the bits in the transmission frame. The exact changeover position is shown in FIG. 3 by the reference label BRSP.

The slower bit rate is designated by bit rate Slow.

The faster bit rate is designated by bit rate Fast.

For the Slow bit rate, a range between 500 kbps and 1500 kbps is specified. All bit rates in steps of 250 kbps are also supported. For the Fast bit rate, a range between 2000 kbps and 12000 kbps is specified. In this range all bit rates in 1000 kbps steps will be supported.

Higher bit rates for the Slow bit rate and the Fast bit rate can optionally be supported.

Figure 4:
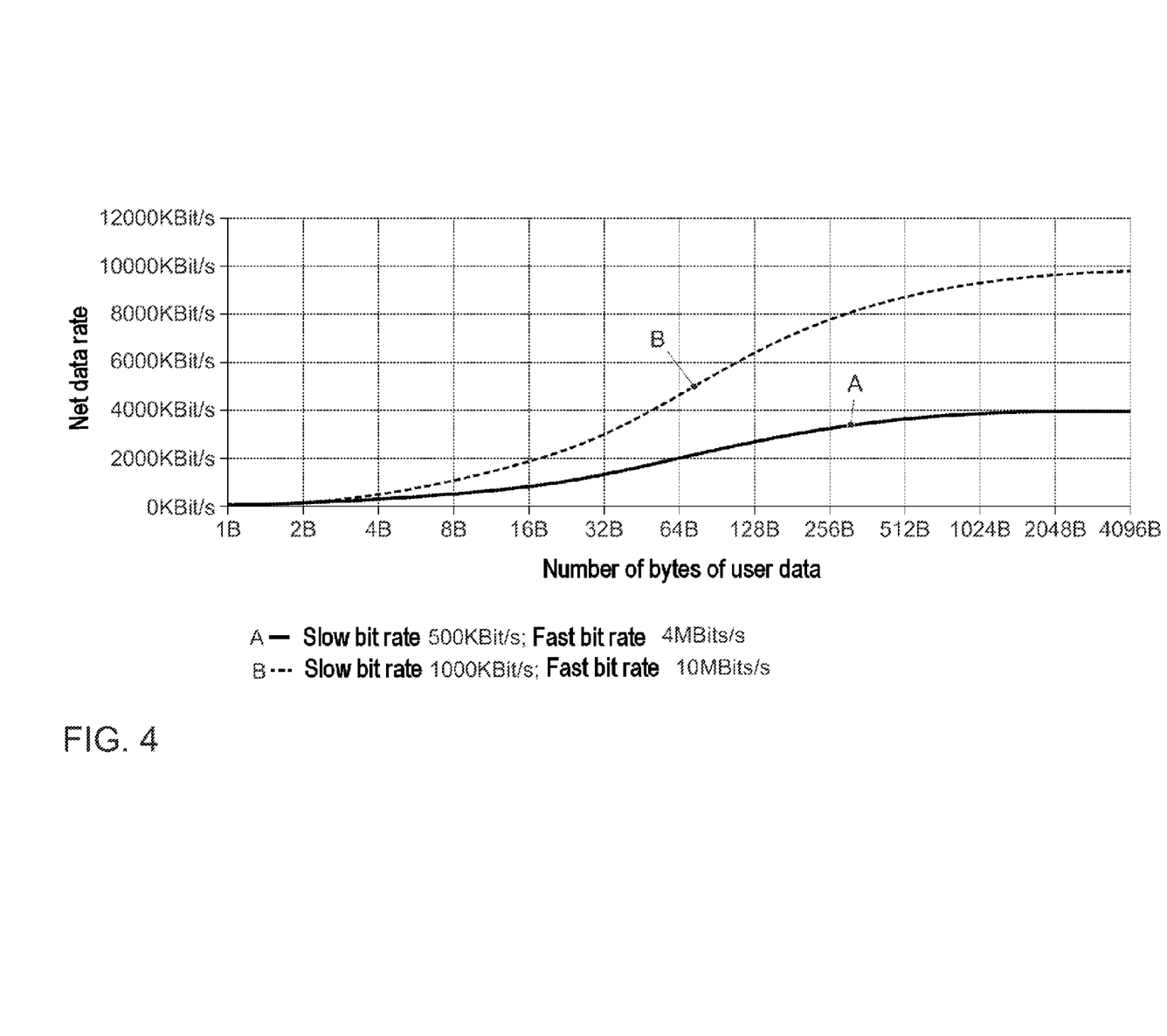
FIG. 4 shows the result of the calculation of the net data rate for transmission of data in packets of different lengths according to the proposed transmission frame format.

An example calculation of the resulting net data rates is shown in FIG. 4. In this, the number of user data bytes transmitted in the transmission frame is plotted along the abscissa, up to the full packet length of 4096 bytes of user data. The resulting net data rate is plotted along the ordinate. The stuff-bits are disregarded in the calculation, however. For the lower curve A, the Slow bit rate was set to 500 kbps and the Fast bit rate to 4 Mbit/s. For the upper curve B, the Slow bit rate was set to 1000 kbps and the Fast bit rate to 10 Mbit/s.

Figure 5:
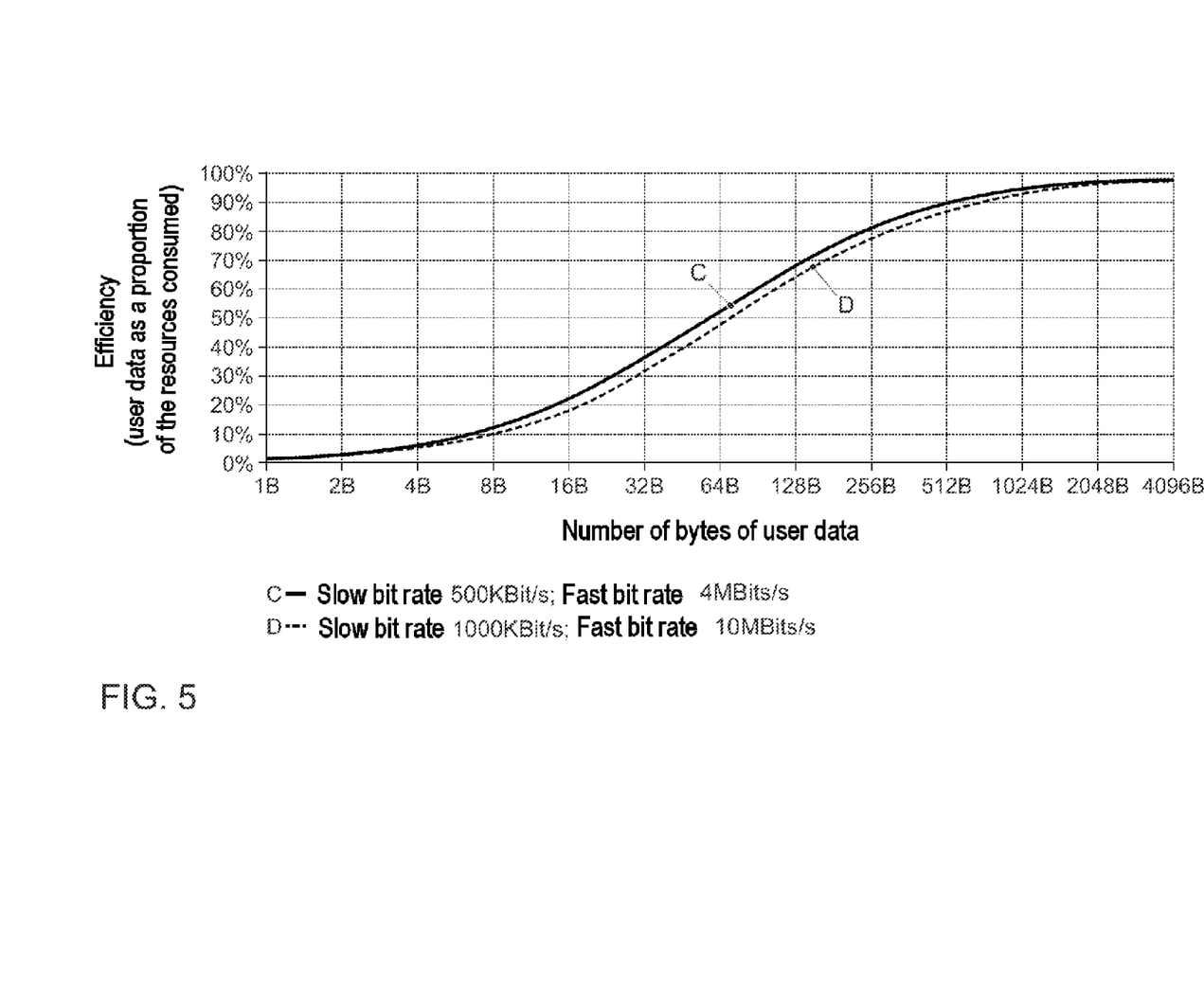
FIG. 5 shows the result of the calculation of the efficiency of the transmission of data in packets of different lengths according to the proposed transmission frame format.

FIG. 5 shows the result of an example calculation of the data transfer efficiency. In this, the number of user data bytes transmitted in the transmission frame is plotted along the abscissa, up to the full packet length of 4096 bytes of user data. The resulting efficiency is plotted along the ordinate as a percentage figure. The stuff-bits are disregarded in the calculation, however. For the upper curve C, the Slow bit rate was set to 500 kbps and the Fast bit rate to 4 Mbit/s. For the lower curve D, the Slow bit rate was set to 1000 kbps and the Fast bit rate to 10 Mbit/s.

In principle, the definition of the identifiers for the CAN messages is not subject to any restrictions.

Taking into account the objective of optimizing the CAN bus for transmission of IP packets, it is helpful to apply an assignment policy with regard to the ID assignment. The compliance with the assignment policy is beneficial in the field of IP communication.

As in the case of the CAN bus and CAN FD, the identifier is used to implement a prioritization concept. The identifier is used as a basis for deciding which CAN node is prevalent on the bus. The bus access method corresponds to the CSMA-CR method (Carrier Sense Multiple Access with Collision Resolution). The CSMA/CR method ensures that transmit-ready CAN nodes only access the CAN bus when it is free. In the case of simultaneous bus accesses, the method of bitwise bus arbitration which underlies the CSMA/CR method ensures that the CAN node with the highest-priority CAN message will always prevail. The following basic principle applies: the higher the priority of a CAN-message, the sooner it can be transmitted on the CAN bus. Under an unfavorable system design, low-priority CAN messages even run the risk of not being transmitted at all. Therefore, the assignment of the IDs is very important for the implementation of a deterministic data transfer.

According to the new concept, the 32 bits of the identifier are broken down into two fields, [Message Content] and [Device].

The field [Message Content] comprises the higher-value bits of the identifier. The [Device] field comprises the lower-order bits of the identifier.

The size of the individual fields can be selected in line with requirements, but must be the same for all subscribers within a CAN network. In an exemplary embodiment, 24 bits are reserved for the [Message Content] field and 8 bits for the [Device] field. It is therefore possible to apply a fine differentiation with regard to the priority of messages in the network. If two subscribers want to send a message with the same priority at the same time, then the decision as to which subscriber device receives the priority is made in the [Device] field.

A lower binary number in the [Message Content] or [Device] field corresponds to an actually higher priority. In the arbitration phase the dominant bus level always prevails on the CAN bus. A CAN node which detects that it itself has only sent the recessive bus level, but detects that the dominant level is present, concedes in the arbitration.

By the appropriate assignment of the device ID, one bus node can be given priority over the other subscribers on the bus. As a result, the network behavior becomes predictable and is therefore real-time capable.

Figure 6:
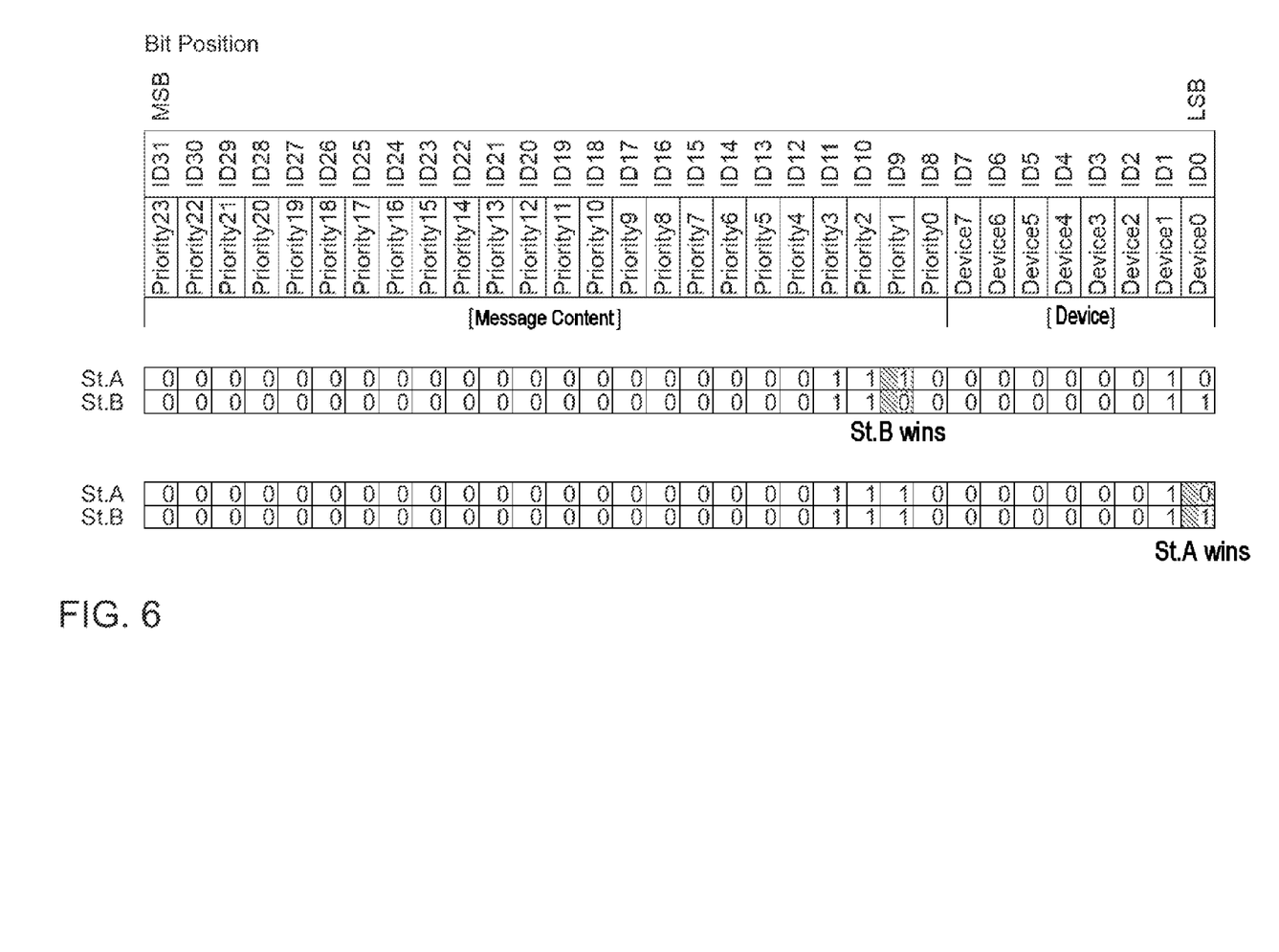
FIG. 6 shows an example of the processing of the arbitration phase, when two CAN nodes access the bus at the same time.

FIG. 6 illustrates the process of arbitration. In the upper part of the figure the individual bit positions of the Arbitration Field AF are numbered from 0 through 31. In the [Message Content] field, for each bit the priority associated with the individual bit position is also specified. The bit position ID8 in the [Message Content] field is given the lowest priority Priority0 and accordingly, the bit position ID31 is given the highest priority Priority23 of the [Message Content] field. Likewise, the bit with the number ID0 in the [Device] field has the lowest priority and the bit with the number ID7 then has the highest priority.

In the middle section of FIG. 6 an arbitration process is shown where two control units St. A and St. B are competing for access to the bus. The St.A control unit has been assigned the device ID 00000010b and the control unit St.B has been assigned the device ID 00000011b. In this case, the bus assignment is decided in the [Message Content] field. In the case illustrated, the subscriber St.B wins, because in bit ID9 it has entered a "0" and the subscriber St.A has entered a "1" there. An entry of "0" corresponds to the dominant bus level in the CAN bus.

In the lower section of FIG. 6 an arbitration process is shown, where again two control units St.A and St.B are competing for access to the bus. In the [Message Content] field both subscribers send the same CAN message, and so here the same ID is sent in the [Message Content] field. Therefore, the bus assignment in this case is only decided in the [Device] field. In the case shown, the subscriber St.A wins, because it has entered a "0" in the last bit with the number ID0 and the subscriber St.B has entered a "1" there.

The disclosure is not limited to the exemplary embodiments described here. There is scope for various adaptations and modifications, which the person skilled in the art due to his expertise would also consider as belonging to the disclosure.

All examples mentioned herein, as well as conditional formulations, are to be understood as being without limitation to such specifically mentioned examples. Thus, for example, it will be acknowledged by persons skilled in the art that the block diagram shown here represents a conceptual view of an exemplary circuit arrangement.

It should be understood that the proposed method and the associated devices can be implemented in various forms of hardware, software, firmware, special processors or a combination of these. Special processors can comprise application specific integrated circuits (ASICs), Reduced Instruction Set Computers (RISC) and/or Field Programmable Gate Arrays (FPGAs). Optionally, the proposed method and the device are implemented as a combination of hardware and software. The software may be installed as an application program on a software storage device. Typically, this will be a machine based on a computer platform, which has hardware such as one or more central processing units (CPU), a random-access memory (RAM) and one or more of the input/output (110) interface(s). In addition, an operating system is typically installed on the computer platform. The various processes and functions which have been described here can either be part of the application program, or executed as part of the operating system.

LIST OF REFERENCE NUMERALS

10 CAN node
12 CAN transceiver
13 terminating resistor
14 CAN controller
15 bus cable
16 host
100 transportation vehicle electronics
102 infotainment CAN bus
104 high-speed CAN bus
105 camera
106 low-speed CAN bus
108 driver assistance CAN bus
110 communication module
120 navigation system
131 operator control unit
132 air-conditioning control unit
133 selection lever control unit
134 door control unit
140 gateway
151 engine control unit
152 ESP control unit
153 transmission control unit
161 sensor 1
162 sensor 2
163 sensor 3
171 driver assistance control unit
172 Radar control unit
A 1st sample curve
B 2nd sample curve
C 3rd sample curve
D 4th sample curve
St.A control unit A
St.B control unit B
BRSP bitrate changeover point

The invention claimed is:

1. A bus interface for transmitting data over a serial communication bus,
wherein a transmission frame transmits the data, wherein the transmission frame has at least one arbitration field and one data field,
wherein the arbitration field controls a bus access according to the Carrier Sense Multiple Access with Collision Resolution method by prioritization of messages based on an identifier,
wherein a low bit rate is set for the arbitration phase and a higher bit rate is set in the data field for the transmission of the data,
wherein the data field has a variable length for an arbitrary number of bytes within a specified upper limit which is greater than 64 bytes,
wherein in the transmission frame a CRC field is provided, wherein at least one section is allocated to a CRC check code,
wherein a start field is provided in the transmission frame and the CRC check code is calculated over the fields Start Field, Arbitration Field, Control Field, and Data Field, and
wherein the data transmission takes place asynchronously and ensures the synchronization of the data transmitting station and data receiving station, a resynchronization is performed according to a bit-stuffing rule, wherein the bit-stuffing rule is applied over the areas from the start field until the end of the data field, wherein the bit-stuffing rule states that a stuff-bit is only inserted after a defined number of successive bits with the same bus level, wherein the defined number is a natural number greater than the number 5, wherein the number of inserted stuff-bits is entered in one section of the CRC field.

2. The bus interface of claim 1, wherein the specified upper limit is the value of 4096 bytes.

3. The bus interface of claim 1, wherein the length of the arbitration field is set to 32 bits.

4. The bus interface of claim 1, wherein a control field is provided in the transmission frame between the arbitration field and the data field, wherein at least one section is allocated for a length specification in terms of the data field.

5. The bus interface of claim 1, wherein an End Field is provided in the transmission frame and at least one end-of-frame code is entered in the End Field, wherein the end-of-frame code has a length of 11 bits.

6. The bus interface of claim 1, wherein a stuff-bit is inserted at fixed specified positions in the CRC field.

7. The bus interface of claim 6, wherein the CRC field starts with a fixed specified stuff-bit and the other fixed specified stuff-bits are each inserted at an interval of 9 bits of the CRC field.

8. The bus interface of claim 1, wherein the identifier field in the arbitration field is sub-divided into sections "Message Content" identifier and "Device" identifier.

9. The bus interface of claim 8, wherein a section with the higher order bits is reserved for the prioritization of the message content and a section with the lower order bits is allocated to the device identification.

10. The bus interface of claim 9, wherein the identifier has a length of 32 bits and the section with the higher order bits has a length of 24 bits and the section with the lower-order bits has a length of 8 bits.

11. A non-transitory computer program product including computer code to execute the transmitter-side operations and/or the receiver-side operations of a method for transmitting data over a serial communication bus, wherein the data is transmitted with a transmission frame when processed in a computation unit wherein the transmission frame has at least one arbitration field and one data field, wherein the arbitration field controls a bus access according to the Carrier Sense Multiple Access with Collision Resolution method by prioritization of messages based on an identifier, wherein a low bit rate is set for the arbitration phase and a higher bit rate is set in the data field for the transmission of the data, wherein the data field has a variable length for an arbitrary number of bytes within a specified upper limit which is greater than 64 bytes,
wherein in the transmission frame a CRC field is provided, wherein at least one section is allocated to a CRC check code,
wherein a start field is provided in the transmission frame and the CRC check code is calculated over the fields Start Field, Arbitration Field, Control Field, and Data Field, and
wherein the data transmission takes place asynchronously and ensures the synchronization of the data transmitting station and data receiving station, a resynchronization is performed according to a bit-stuffing rule, wherein the bit-stuffing rule is applied over the areas from the start field until the end of the data field, wherein the bit-stuffing rule states that a stuff-bit is only inserted after a defined number of successive bits with the same bus level, wherein the defined number is a natural number greater than the number 5, wherein the number of inserted stuff-bits is entered in one section of the CRC field.

12. A non-transitory computer program product of claim 11, wherein the specified upper limit is the value of 4096 bytes.

13. A non-transitory computer program product of claim 11, wherein the length of the arbitration field is set to 32 bits.

14. The non-transitory computer program product of claim 11, wherein a control field is provided in the transmission frame between the arbitration field and the data field, wherein at least one section is allocated for a length specification in terms of the data field.

15. A non-transitory computer program product of claim 11, wherein an End Field is provided in the transmission frame and at least one end-of-frame code is entered in the End Field, wherein the end-of-frame code has a length of 11 bits.

16. A non-transitory computer program product of claim 11, wherein a stuff-bit is inserted at fixed specified positions in the CRC field.

17. A non-transitory computer program product of claim 16, wherein the CRC field starts with a fixed specified stuff-bit and the other fixed specified stuff-bits are each inserted at an interval of 9 bits of the CRC field.

18. A non-transitory computer program product of claim 11, wherein the identifier field in the arbitration field is sub-divided into sections "Message Content" identifier and "Device" identifier.

19. A non-transitory computer program product of claim 18, wherein a section with the higher order bits is reserved for the prioritization of the message content and a section with the lower order bits is allocated to the device identification.

20. A non-transitory computer program product of claim 19, wherein the identifier has a length of 32 bits and the section with the higher order bits has a length of 24 bits and the section with the lower-order bits has a length of 8 bits.

21. A method for transmitting data over a serial communication bus, wherein the data is transmitted with a transmission frame, wherein the transmission frame has at least one arbitration field and one data field, wherein the arbitration field controls a bus access according to the CSMA-CR method (Carrier Sense Multiple Access with Collision Resolution) by prioritization of messages based on an identifier, wherein a low bit rate is set for the arbitration phase and a higher bit rate is set in the data field for the transmission of the data, wherein the data field has a variable length for an arbitrary number of bytes within a specified upper limit which is greater than 64 bytes, wherein in the transmission frame a CRC field is provided, wherein at least one section is allocated to a CRC check code, wherein a start field is provided in the transmission frame and the CRC check code is calculated over the fields Start Field, Arbitration Field, Control Field, and Data Field, and wherein the data transmission takes place asynchronously and ensures the synchronization of the data transmitting station and data receiving station, a resynchronization is performed according to a bit-stuffing rule, wherein the bit-stuffing rule is applied over the areas from the start field until the end of the data field, wherein the bit-stuffing rule states that a stuff-bit is only inserted after a defined number of successive bits with the same bus level, wherein the defined number is a natural number greater than the number 5, wherein the number of inserted stuff-bits is entered in one section of the CRC field.

22. The method of claim 21, wherein the specified upper limit is the value of 4096 bytes.

23. The method of claim 21, wherein the length of the arbitration field is set to 32 bits.

24. The method of claim 21, wherein a control field is provided in the transmission frame between the arbitration field and the data field, wherein at least one section is allocated for a length specification in terms of the data field.

25. The method of claim 21, wherein an End Field is provided in the transmission frame and at least one end-of-frame code is entered in the End Field, wherein the end-of-frame code has a length of 11 bits.

26. The method of claim 21, wherein a stuff-bit is inserted at fixed specified positions in the CRC field.

27. The method of claim 26, wherein the CRC field starts with a fixed specified stuff-bit and the other fixed specified stuff-bits are each inserted at an interval of 9 bits of the CRC field.

28. The method of claim 21, wherein the identifier field in the arbitration field is sub-divided into sections "Message Content" identifier and "Device" identifier.

29. The method of claim 28, wherein a section with the higher order bits is reserved for the prioritization of the message content and a section with the lower order bits is allocated to the device identification.

30. The method of claim 29, wherein the identifier has a length of 32 bits and the section with the higher order bits has a length of 24 bits and the section with the lower-order bits has a length of 8 bits.

* * * * *